United States Patent
Li et al.

(10) Patent No.: US 10,355,019 B1
(45) Date of Patent: Jul. 16, 2019

(54) SEMICONDUCTOR DEVICE (71) Applicant: UNITED MICROELECTRONICS CORP., Hsin-Chu (TW)

(72) Inventors: Xiang Li, Singapore (SG); Ding-Lung Chen, Singapore (SG); Yu-Cheng Tung, Kaohsiung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/024,906

(22) Filed: Jul. 1, 2018

(30) Foreign Application Priority Data

Jun. 1, 2018 (TW) .............................. 107118989 A (51) Int. Cl.
| | |
|---|---|
| *H01L 27/12* | (2006.01) |
| *H01L 27/06* | (2006.01) |
| *H01L 27/092* | (2006.01) |
| *H01L 29/786* | (2006.01) |
| *H01L 23/528* | (2006.01) |
| *H01L 29/861* | (2006.01) |

(52) U.S. Cl.
CPC ...... *H01L 27/1207* (2013.01); *H01L 23/5286* (2013.01); *H01L 27/0629* (2013.01); *H01L 27/092* (2013.01); *H01L 29/7869* (2013.01); *H01L 29/78648* (2013.01); *H01L 29/78666* (2013.01); *H01L 29/78675* (2013.01); *H01L 29/8611* (2013.01)

(58) Field of Classification Search
CPC ........... H01L 27/1207; H01L 29/78675; H01L 29/8611; H01L 29/78648; H01L 29/7869; H01L 29/78666; H01L 27/092; H01L 27/0629; H01L 23/5286
See application file for complete search history.

(56) References Cited

U.S. PATENT DOCUMENTS

| | | | |
|---|---|---|---|
| 2007/0023779 A1* | 2/2007 | Hirose | ................ H01L 27/0255 257/173 |
| 2013/0062632 A1* | 3/2013 | Lee | ..................... H01L 25/0753 257/88 |
| 2015/0001551 A1* | 1/2015 | Kashyap | ............. H01L 21/8232 257/77 |

* cited by examiner

*Primary Examiner* — Karen Kusumakar
(74) *Attorney, Agent, or Firm* — Winston Hsu (57) ABSTRACT

A semiconductor device includes a substrate, a first transistor, a first diode structure, and a second diode structure. The first transistor is disposed on the substrate. The first transistor includes a first gate electrode, a first source electrode, and a first drain electrode. The first gate electrode is connected to the substrate by the first diode structure. The first drain electrode is connected to the substrate by the second diode structure. The first diode structure and the second diode structure may be used to improve potential unbalance in the transistor, and operation performance and reliability of the semiconductor device may be enhanced accordingly.

15 Claims, 6 Drawing Sheets

SEMICONDUCTOR DEVICE

BACKGROUND OF THE INVENTION

1. Field of the Invention

The present invention relates to a semiconductor device, and more particularly, to a semiconductor device including a diode structure.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. The general semiconductor manufacturing process may be roughly divided into a front end of line (FEOL) process for forming transistors on a wafer and a back end of line (BEOL) process for forming parts such as contact structures, interlayer dielectric layers, interconnection structures, and contact pads above the transistors. However, many other active or passive devices are also designed to be formed by the BEOL process as the required integrity of the integrated circuits becomes higher and higher, and many operation problems of the devices are generated and have to be solved accordingly.

SUMMARY OF THE INVENTION

A semiconductor device is provided in the present invention. A diode structure is applied to connect a gate electrode of a transistor and a substrate, and another diode structure is applied to connect a drain electrode of the transistor and the substrate for improving electrical field unbalance in the transistor. The operation performance and the reliability of the semiconductor device may be improved accordingly.

According to an embodiment of the present invention, a semiconductor device is provided. The semiconductor device includes a substrate, a first transistor, a first diode structure, and a second diode structure. The first transistor is disposed on the substrate. The first transistor includes a first gate electrode, a first source electrode, and a first drain electrode. The first gate electrode is connected to the substrate by the first diode structure. The first drain electrode is connected to the substrate by the second diode structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
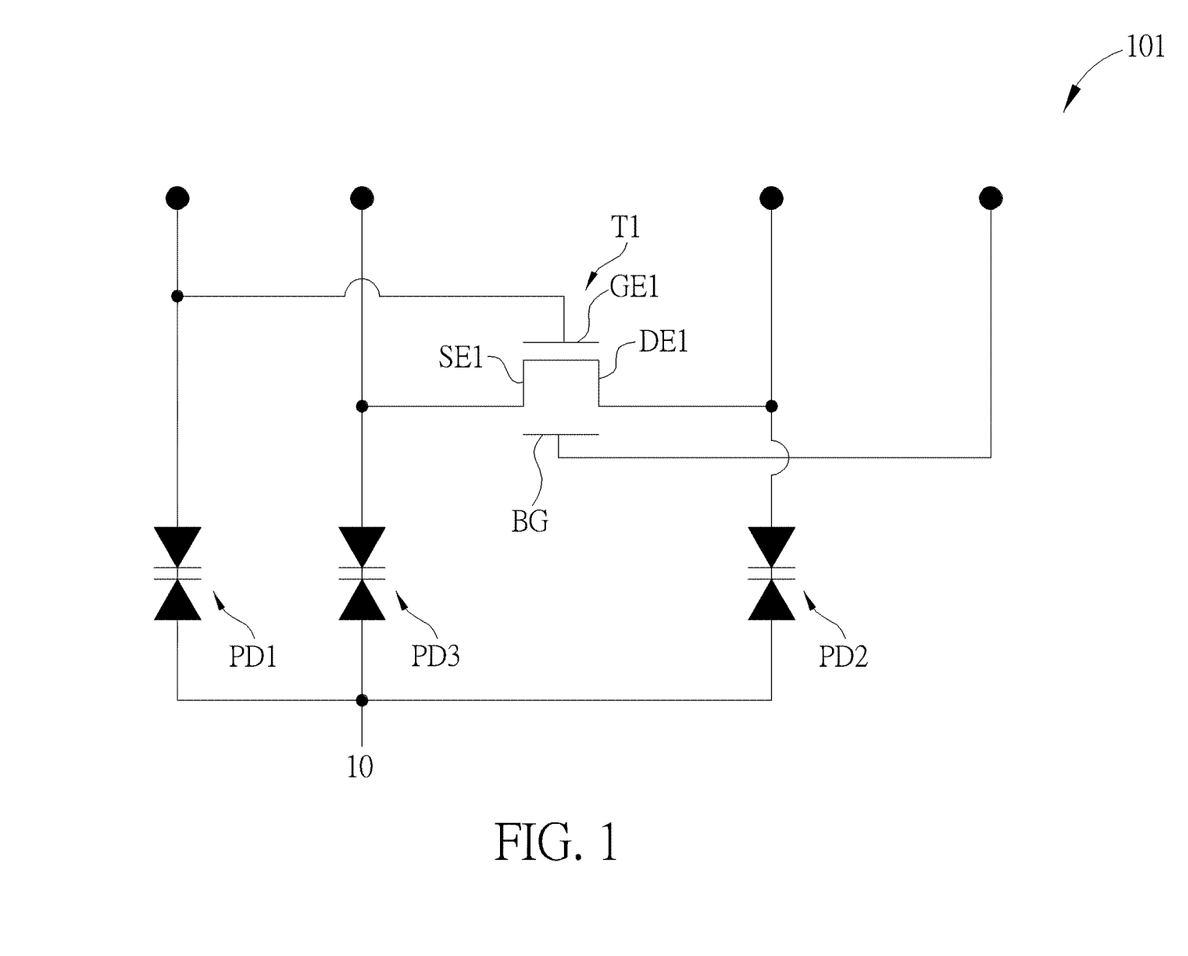
FIG. 1 is a schematic circuit diagram of a semiconductor device according to a first embodiment of the present invention.
Figure 2:
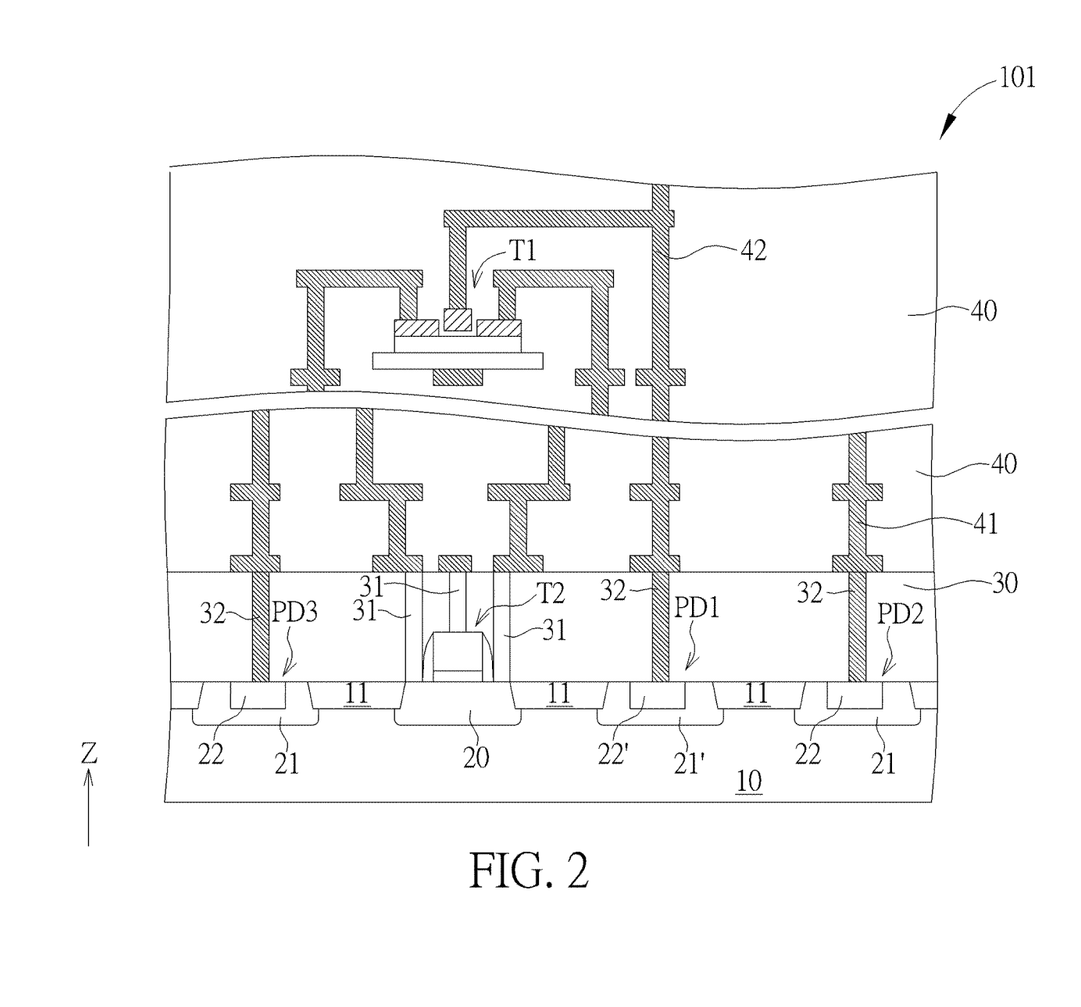
FIG. 2 is a schematic drawing illustrating the semiconductor device according to the first embodiment of the present invention.
Figure 3:
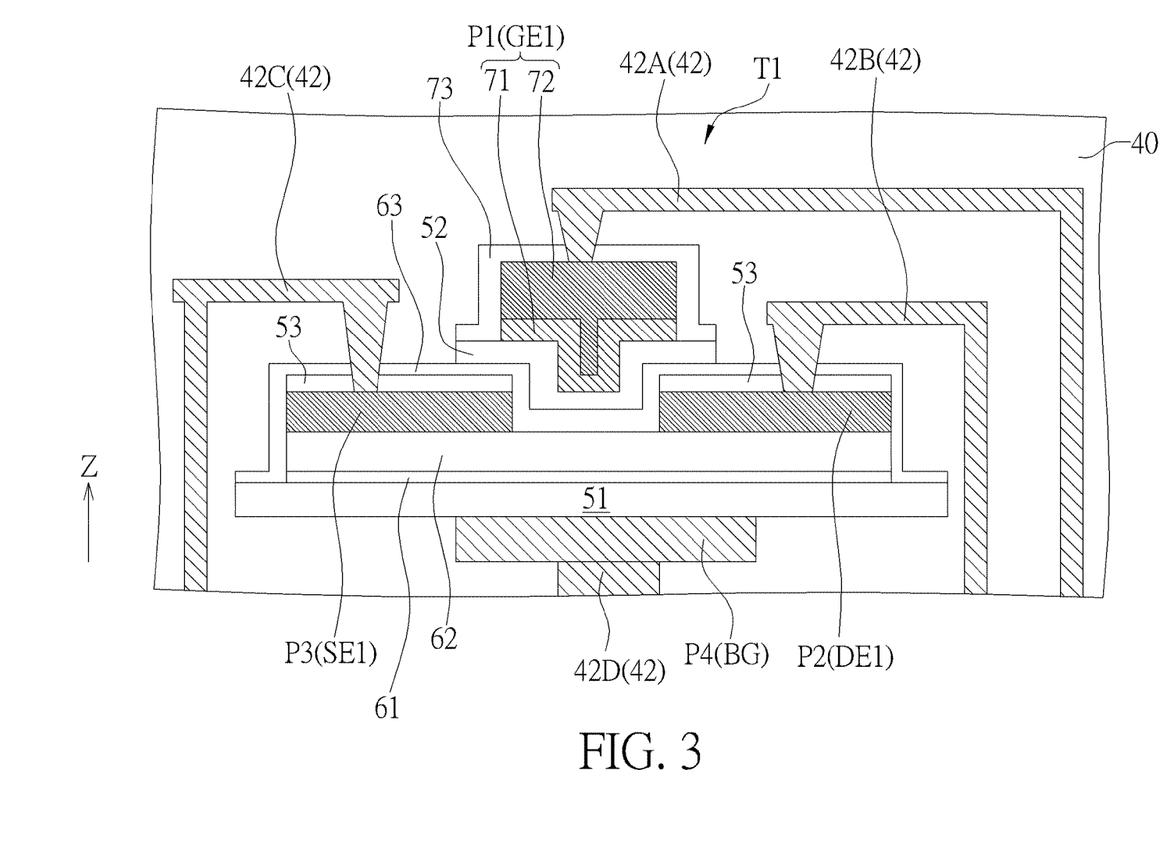
FIG. 3 is a partial enlarged view of the semiconductor device according to the first embodiment of the present invention.

Please refer to FIG. 1, FIG. 2, and FIG. 3. FIG. 1 is a schematic circuit diagram of a semiconductor device according to a first embodiment of the present invention. FIG. 2 is a schematic drawing illustrating the semiconductor device in this embodiment. FIG. 3 is a partial enlarged view of the semiconductor device in this embodiment. As shown in FIG. 1, FIG. 2, and FIG. 3, a semiconductor device 101 is provided in this embodiment. The semiconductor device 101 includes a substrate 10, a first transistor T1, a first diode structure PD1, and a second diode structure PD2. The first transistor T1 is disposed on the substrate 10. The first transistor T1 includes a first gate electrode GE1, a first source electrode SE1, and a first drain electrode DE1. The first gate electrode GE1 is connected to the substrate 10 by the first diode structure PD1, and the first drain electrode DE1 is connected to the substrate 10 by the second diode structure PD2. In some embodiments, the semiconductor device 101 may further include a third diode structure PD3, and the first source electrode SE1 of the first transistor T1 may be connected to the substrate 10 by the third diode structure PD3, but not limited thereto. All terminals of the first transistor T1, such as the first gate electrode GE1, the first source electrode SE1, and the first drain electrode DE1, may be connected to the substrate 10 for forming charge release paths by the first diode structure PD1, the second diode structure PD2, and the third diode structure PD3. The potential unbalance issue in the transistor when only a part of the terminals (such as the gate electrode) is connected to the substrate 10 may be avoided accordingly, and problems such as plasma induced damage (PID) in the semiconductor device 101 may be improved.

The first diode structure PD1, the second diode structure PD2, and the third diode structure PD3 may have identical structures or different structures. For example, in some embodiments, the first diode structure PD1, the second diode structure PD2, and the third diode structure PD3 may include two diodes facing each other respectively. The diode structure may be composed of the two diodes having different polarities and connected in series. One end of the diode structure is connected with a corresponding terminal (such as the first gate electrode GE1, the first source electrode SE1, or the first drain electrode DE1), and another end of the diode structure is connected to the substrate 10 for forming the charge release paths because the first diode structure PD1, the second diode structure PD2, and the third diode structure PD3 may be open when sudden high voltage and/or high current occurs at the terminals of the first transistor T1, and the purposes of circuit protection and potential balance may be achieved accordingly. It is worth noting that the structures of the first diode structure PD1, the second diode structure PD2, and the third diode structure PD3 are not limited to the condition described above and other diode structures connected to the substrate 10 without influencing the operation of the first transistor T1 may also be applied in the present invention. The structures of the first diode structure PD1, the second diode structure PD2, and the third diode structure PD3 may be different from one another according to some considerations also.

In some embodiments, the substrate 10 may include a semiconductor substrate, such as a silicon substrate, silicon germanium substrate, or silicon-on-insulator (SOI) substrate, or other suitable types of semiconductor substrates. The semiconductor 101 may further include a second transistor T2, a first interconnection 41, and a second interconnection structure 42. The second transistor T2, the first interconnection 41, and the second interconnection structure 42 are disposed on the substrate 10. The second transistor T2 may be disposed between the first interconnection structure 41 and the substrate 10, the first interconnection structure may be disposed between the first transistor T1 and the substrate 10, and the first transistor T1 may be disposed in the second interconnection structure 42, but not limited thereto. Additionally, the first diode structure PD1, the second diode structure PD2, and the third diode structure PD3 may be disposed in the substrate 10. For example, a first well 20, a plurality of second wells 21, a third well 21', a plurality of first doped regions 22, and a second doped region 22' may be disposed in the substrate 10. The first well 20 may be disposed corresponding to the second transistor T2. Each of the first doped regions 22 may be disposed in one of the second wells 21, and the second doped region 22' may be disposed in the third well 21'. The first well 20, the second wells 21, and the third well 21' may be separated from one another by isolation structures 11, but not limited thereto. In some embodiments, the second wells 21 may have a first conductivity type, and the first doped regions 22 and the substrate 10 may have a second conductivity type complementary to the first conductivity type. For example, when the substrate 10 is a P type semiconductor substrate, the second well 21 may be an N type well, and the first doped region 22 may be a P+ doped region, but not limited thereto. Additionally, the first well 20 may be an N type well or a P type well when the substrate 10 is a P type semiconductor substrate. In other words, the conductivity type of the first well 20 disposed corresponding to the second transistor T2 may be identical to or complementary to the conductivity type of the second wells 21. In addition, the conductivity type of the third well 21' may be complementary to the conductivity type of the second doped region 22', the conductivity type of the third well 21' may be identical to or different from the conductivity type of the second well 21, and the conductivity type of the second doped region 22' may be identical to or different from the conductivity type of the first doped region 22. For instance, the conductivity type of the third well 21' may be complementary to the conductivity type of the second well 21, but not limited thereto. In some embodiments, the second diode structure PD2 and the third diode structure PD3 described above may include one of the second wells 21 and the first doped region 22 disposed therein respectively, the first diode structure PD1 described above may include the third well 21' and the second doped region 22' disposed therein, and first diode structure PD1, the second diode structure PD2, and the third diode structure PD3 may be separated from one another. In some embodiments, the second well 21 and the third well 21' may be identical to or different from each other, and the first doped region 22 and the second doped region 22' may be identical to or different from each other by adjusting the related doping processes. Therefore, the first diode structure PD1 may be identical to or different from the second diode structure PD2 according to some considerations. The above mentioned diode structure including two diodes having different polarities and connected in series may be composed of the first doped region 22 having the first conductivity type, the second well 21 having the second conductivity type, and the substrate 10 having the first conductivity type, but the present invention is not limited to this. In some embodiments, the first diode structure PD1, the second diode structure PD2, and the third diode structure PD3 described above may be disposed in other positions (such as in the first interconnection structure 41) according to some considerations.

Additionally, in some embodiments, the semiconductor device 101 may further include a dielectric layer 30, a plurality of first connection plugs 31, a plurality of second connection plugs 32, and an interlayer dielectric layer 40. The dielectric layer 30 may cover the second transistor T2, the first diode structure PD1, the second diode structure PD2, and the third diode structure PD3. The interlayer dielectric layer 40 may be disposed on the dielectric layer 30. The first interconnection structure 41, the second interconnection structure 42, and the first transistor T1 may be disposed in the interlayer dielectric layer 40. The dielectric layer 30 and the interlayer dielectric layer 40 may respectively include stacked layers of dielectric materials, such as silicon oxide, silicon oxynitride, low dielectric constant (low-k) materials, or other suitable dielectric materials. The first interconnection structure 41 and the second interconnection structure 42 may respectively include a plurality of metal conductive layers, and a plurality of conductive plugs alternately disposed in the thickness direction Z of the substrate 10 for forming the connection. The metal conductive layers of the first interconnection structure 41 and the second interconnection structure 42, the conductive plugs of the first interconnection structure 41 and the second interconnection structure 42, the first connection plugs 31, and the second connection plugs 32 may respectively include metal conductive materials such as tungsten (W), aluminum (Al), copper (Cu), titanium aluminide (TiAl), titanium (Ti), titanium nitride (TiN), tantalum (Ta), tantalum nitride (TaN), titanium aluminum oxide (TiAlO), or other suitable metal or non-metal conductive materials. The first connection plugs 31 may be disposed in the dielectric layer 30 for connecting each terminal (such as the gate electrode, the source electrode, or the drain electrode) to the first interconnection structure 41, and the second connection plugs 32 may be disposed in the dielectric layer 30 for connecting the first diode structure PD1 to the first interconnection structure 41, connecting the second diode structure PD2 to the first interconnection structure 41, and connecting the third diode structure PD3 to the first interconnection structure 41 respectively, but not limited thereto. In addition, as shown in FIG. 2 and FIG. 3, the first gate electrode GE1, the first drain electrode DE1, and the first source electrode SE1 of the first transistor T1 may be connected with a first connection structure 42A, a second connection structure 42B, and a third connection structure 42C in the second interconnection structure 42 respectively. The first connection structure 42A, the second connection structure 42B, and the third connection structure 42C may be composed of the metal conductive layers and the conductive plugs of the second interconnection structure 42 respectively. The first diode structure PD1 may be connected with the first gate electrode GE1 by the second connection plug 32, the first interconnection structure 41, and the first connection structure 42A of the second interconnection structure 42, the second diode structure PD2 may be connected with the first drain electrode DE1 by the second connection plug 32, the first interconnection structure 41, and the second connection structure 42B of the second interconnection structure 42, and the third diode structure PD3 may be connected with the first source electrode SE1 by the second connection plug 32, the first interconnection structure 41, and the third connection structure 42C of the second interconnection structure 42, but not limited thereto.

As shown in FIG. 2 and FIG. 3, the first transistor T1 may include an oxide semiconductor transistor, an amorphous silicon semiconductor transistor, a polysilicon semiconductor transistor, or other suitable types of transistors. For example, when the first transistor T1 is an oxide semiconductor transistor, the first transistor T1 may include the first gate electrode GE1, the first drain electrode DE1, the first source electrode SE1, a back gate electrode BG, a first gate dielectric layer 51, a first semiconductor layer 61, a second semiconductor layer 62, a third semiconductor layer 63, and a second gate dielectric layer 52. The back gate electrode BG may be disposed under the first gate dielectric layer 51; the first semiconductor layer 61 may be disposed on the first gate dielectric layer 51; the second semiconductor layer 62 may be disposed on the first semiconductor layer 61; the first drain electrode DE1 and the first source electrode SE1 may be disposed on the second semiconductor layer 62; the third semiconductor layer 63 may be disposed on the first drain electrode DE1, the first source electrode SE1, and the second semiconductor layer 62; the second gate dielectric layer 52 may be disposed on the third semiconductor layer 63; and the first gate electrode GE1 may be disposed on the second gate dielectric layer 52, but not limited thereto. In other words, the first transistor T1 may include a dual gate transistor structure in some embodiments, but the present invention is not limited to this. In some embodiments, the first transistor T1 may be a top gate transistor structure or a bottom gate transistor structure according to some considerations. Additionally, in some embodiments, the first transistor T1 may further include a cap layer 53 and a protection layer 73, and the first gate electrode GE1 may be composed of a barrier layer 71 and a conductive layer 72 according to some considerations, but not limited thereto. The cap layer 53 may be disposed between the third semiconductor layer 63 and the first drain electrode DE1 and be disposed between the third semiconductor layer 63 and the first source electrode SE1, and the cap layer 53 may include a conductive material and/or a barrier material, but not limited thereto. The protection layer 73 may be used to cover the first gate electrode GE1 for providing the protection effect to the first gate electrode GE1.

In some embodiments, the barrier layer 71 and the conductive layer 72 of the first gate electrode GE1, the first drain electrode DE1, the first source electrode SE1, and the back gate electrode BG may respectively include metal conductive materials, such as tungsten, aluminum, copper, titanium aluminide, titanium, titanium nitride, tantalum, tantalum nitride, titanium aluminum oxide, or other suitable metal or non-metal conductive materials. The first gate dielectric layer 51 and the second gate dielectric layer 52 may include silicon oxide, silicon oxynitride, high dielectric constant (high-k) materials, or other suitable dielectric materials. The high-k materials mentioned above may include hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other appropriate high-k materials. The first semiconductor layer 61, the second semiconductor layer 62, and the third semiconductor layer 63 may include II-VI compounds (such as zinc oxide, ZnO), II-VI compounds doped with alkaline-earth metals (such as zinc magnesium oxide, ZnMgO), II-VI compounds doped with IIIA compounds (such as indium gallium zinc oxide, IGZO), II-VI compounds doped with VA compounds (such as stannum stibium oxide, $SnSbO_2$), II-VI compounds doped with VIA compounds (such as zinc selenium oxide, ZnSeO), II-VI compounds doped with transition metals (such as zinc zirconium oxide, ZnZrO), or other oxide semiconductor materials composed of mixtures of the above-mentioned elements, but not limited thereto. Additionally, the crystalline conditions of the above-mentioned oxide semiconductor materials are also not limited. For example, the above-mentioned oxide semiconductor materials may be amorphous IGZO (a-IGZO), crystal IGZO (c-IGZO), or C-axis aligned crystal IGZO (CAAC-IGZO). In some embodiments, the first semiconductor layer 61 and the third semiconductor layer 62 may be used as barrier layers surrounding the second semiconductor layer 62 for keeping unwanted materials, such as silicon, from entering the second semiconductor layer 62, which may be regarded as the main channel layer of the first transistor T1, and influencing the semiconductor characteristics of the second semiconductor layer 62, and an energy level of a bottom of a conduction band of the second semiconductor layer 62 may be lower than an energy level of a bottom of a conduction band of the first semiconductor layer 61 and an energy level of a bottom of a conduction band of the third semiconductor layer 63 preferably, but not limited thereto. Additionally, in some embodiments, an electrical resistivity of the second semiconductor layer 62 may be higher than an electrical resistivity of the first semiconductor layer 61 and an electrical resistivity of the third semiconductor layer 63, but not limited thereto. It is worth noting that, when the first transistor T1 is other type of transistor, the first semiconductor layer 61, the second semiconductor layer 62, and the third semiconductor layer 63 may include other semiconductor materials, such as a polysilicon semiconductor material or an amorphous silicon semiconductor material. In addition, the semiconductor device 101 may further include a fourth connection structure 42D connected with the back gate electrode BG, and the back gate electrode BG and the fourth connection structure 42D may be formed by the process of forming one of the metal conductive layers of the second interconnection structure 42 and the process of forming one of the conductive plugs of the second interconnection structure 42 respectively, but not limited thereto.

Figure 4:
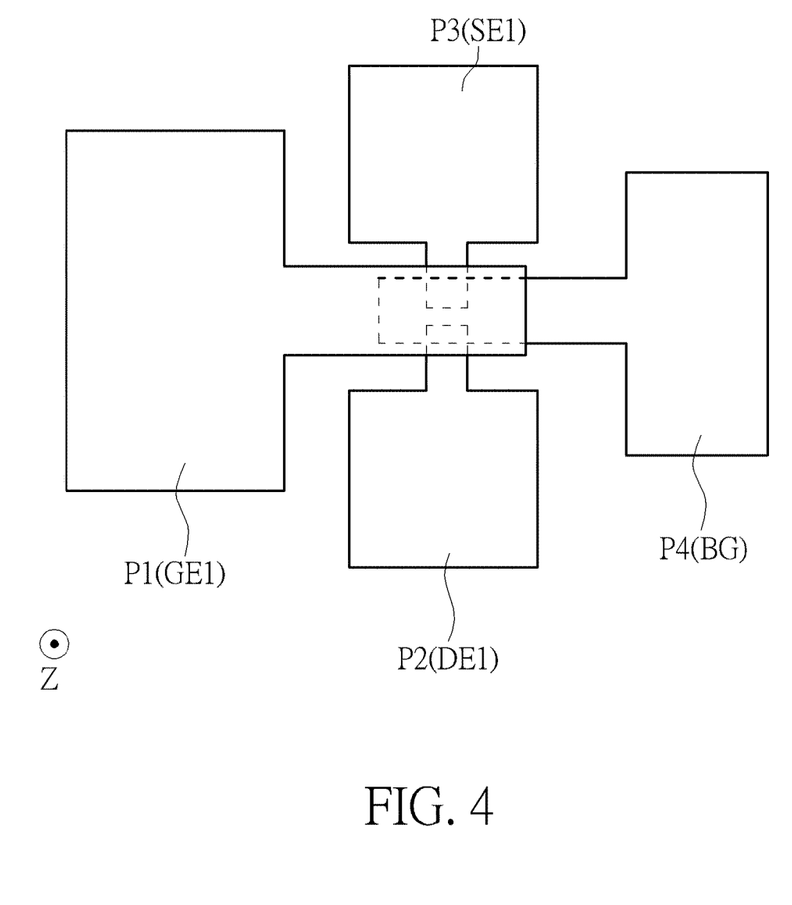
FIG. 4 is a schematic top view of a first transistor according to the first embodiment of the present invention.

Please refer to FIG. 3 and FIG. 4. FIG. 4 is a schematic top view of the first transistor T1 in this embodiment. As shown in FIG. 3 and FIG. 4, the first gate electrode GE1, the first drain electrode DE1, the first source electrode SE1, and the back gate electrode BG may include a first connection pad P1, a second connection pad P2, a third connection pad P3, and a fourth connection pad P4 respectively. The first connection structure 42A, the second connection structure 42B, the third connection structure 42C, and the fourth connection structure 42D may be connected with the first connection pad P1, the second connection pad P2, the third connection pad P3, and the fourth connection pad P4 respectively from the top sides or the bottom sides of the first connection pad P1, the second connection pad P2, the third connection pad P3, and the fourth connection pad P4.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
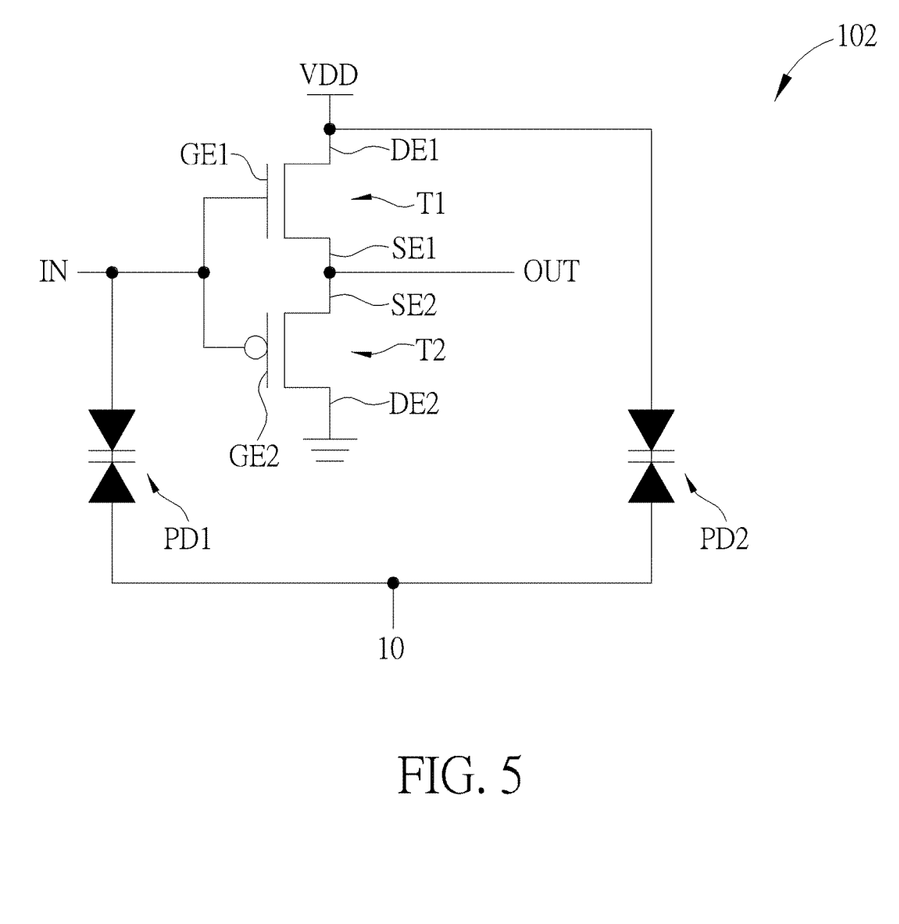
FIG. 5 is a schematic circuit diagram of a semiconductor device according to a second embodiment of the present invention.
Figure 6:
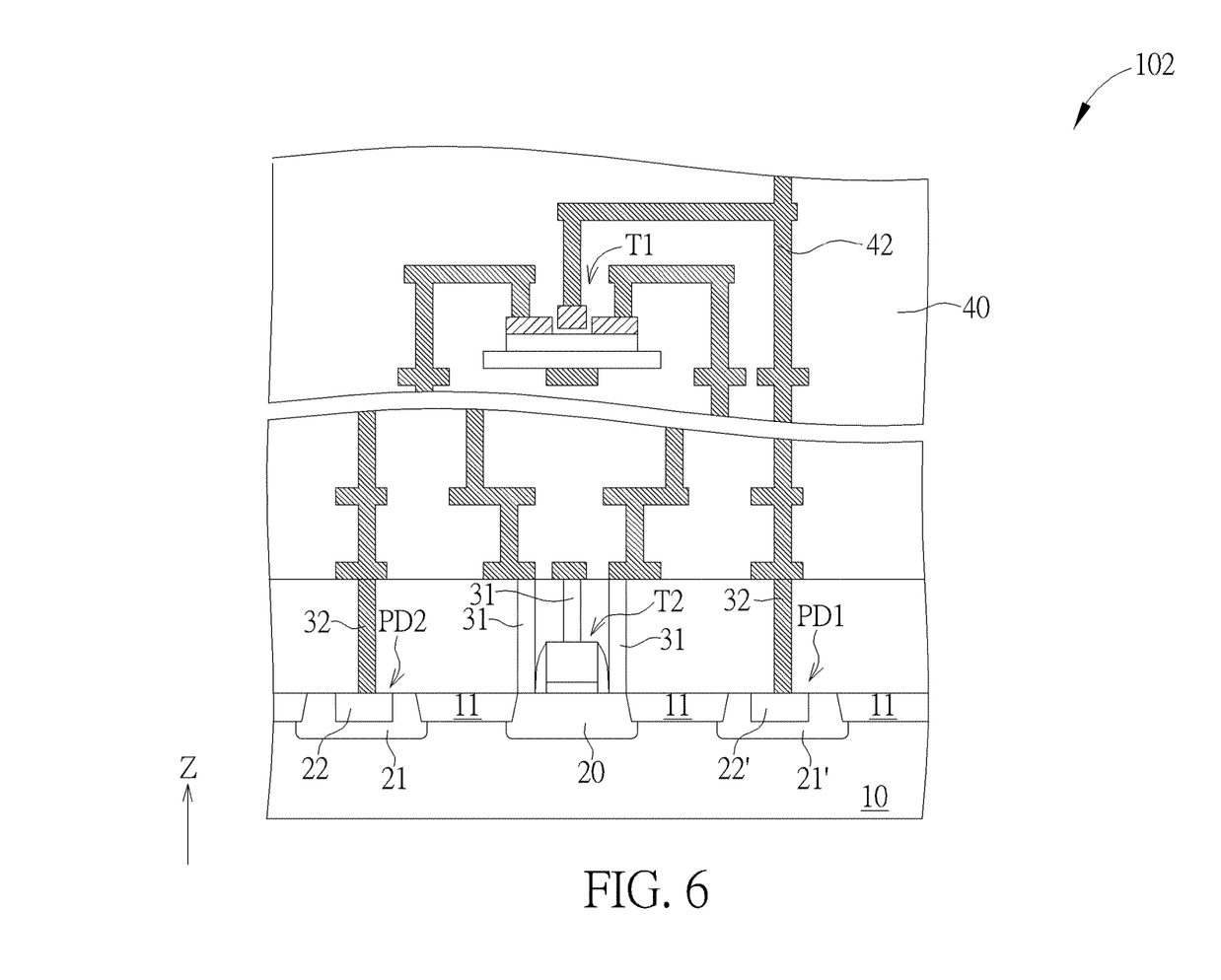
FIG. 6 is a schematic drawing illustrating the semiconductor device according to the second embodiment of the present invention.

Please refer to FIG. 5, FIG. 6, and FIG. 3. FIG. 5 is a schematic circuit diagram of a semiconductor device 102 according to a second embodiment of the present invention, FIG. 6 is a schematic drawing illustrating the semiconductor device 102 in this embodiment, and FIG. 3 may be regarded as a schematic drawing illustrating the first transistor of the semiconductor device 102 in this embodiment. As shown in FIG. 5, FIG. 6, and FIG. 3, the second transistor T2 in this embodiment may include a second gate electrode GE2, a second source electrode SE2, and a second drain electrode DE2. The difference between the semiconductor device 102 in this embodiment and the semiconductor device in the first embodiment described above is that the first gate electrode GE1 of the first transistor T1 may be coupled with the second gate electrode GE2 of the second transistor T2 in this embodiment, and the first gate electrode GE1 and the second gate electrode GE2 may be connected to an input terminal IN. The first source electrode SE1 of the first transistor T1 may be coupled with the second source electrode SE2 of the second transistor T2 in this embodiment, and the first source electrode SE1 and the second source electrode SE2 may be connected to an output terminal OUT. The first drain electrode DE1 of the first transistor T1 may be coupled to a power supply voltage VDD, and the second drain electrode DE2 of the second transistor T2 may be coupled to a ground voltage potential. The circuit shown in FIG. 5 may be regarded as an inverter. The first gate electrode GE1 and the first drain electrode DE1 of the first transistor T1 may be connected to the substrate 10 for forming charge release paths by the first diode structure PD1 and the second diode structure PD2, and the charge release path for the first source electrode SE1 of the first transistor T1 may be formed by the second transistor T2 in this embodiment. The potential unbalance issue in the first transistor T1 may be avoided accordingly, and problems such as plasma induced damage in the semiconductor device 102 may be improved. Additionally, in this embodiment, the first transistor T1 may include an N-type transistor, and the second transistor T2 may include a P-type transistor, but not limited thereto. In some embodiments, the second gate electrode GE2 of the second transistor T2 may be connected to the first gate electrode GE1 of the first transistor T1 by the first connection plug 31, the first interconnection structure 41, and the second interconnection structure 42; and the second source electrode SE2 of the second transistor T2 may be connected to the first source electrode SE1 of the first transistor T1 by the first connection plug 31, the first interconnection structure 41, and the second interconnection structure 42, but not limited thereto. Additionally, it is worth noting that the circuit structure formed by integrating the first transistor T1 disposed in the second interconnection structure 42 and the second transistor T2 disposed on the substrate 10 is not limited to the inverter described above. The potential balance of the first transistor T1 in other circuit structures composed of the first transistor T1 and the second transistor T2 may also be improved by disposing diode structures.

To summarize the above descriptions, in the semiconductor device of the present invention, a plurality of the diode structures may be used to connect the terminals of the first transistor to the substrate for improving the potential unbalance in the first transistor and enhancing the manufacturing yield, the operation performance, and the reliability of the semiconductor device accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a first transistor disposed on the substrate, wherein the first transistor comprises a first gate electrode, a first source electrode, and a first drain electrode;
   a first diode structure, wherein the first gate electrode is connected to the substrate by the first diode structure;
   a second diode structure, wherein the first drain electrode is connected to the substrate by the second diode structure; and
   a third diode structure, wherein the first source electrode is connected to the substrate by the third diode structure.

2. The semiconductor device according to claim 1, wherein the first diode structure comprises two diodes facing each other.

3. The semiconductor device according to claim 1, wherein the second diode structure comprises two diodes facing each other.

4. The semiconductor device according to claim 1, wherein the first diode structure and the second diode structure are separated from each other.

5. The semiconductor device according to claim 1, further comprising:
   an interconnection structure disposed between the first transistor and the substrate; and
   a second transistor disposed between the interconnection structure and the substrate.

6. The semiconductor device according to claim 5, wherein the first diode structure and the second diode structure are disposed in the substrate.

7. The semiconductor device according to claim 6, wherein the first diode structure is connected with the first gate electrode by the interconnection structure, and the second diode structure is connected with the first drain electrode by the interconnection structure.

8. The semiconductor device according to claim 6, wherein the second diode structure comprises:
   a well having a first conductivity type; and
   a doped region disposed in the well, wherein the doped region and the substrate have a second conductivity type complementary to the first conductivity type.

9. The semiconductor device according to claim 1, wherein the first transistor comprises an oxide semiconductor transistor, an amorphous silicon semiconductor transistor, or a polysilicon semiconductor transistor.

10. The semiconductor device according to claim 1, wherein the third diode structure comprises two diodes facing each other.

11. The semiconductor device according to claim 1, wherein the first diode structure, the second diode structure, and the third diode structure are separated from one another.

12. The semiconductor device according to claim 1, further comprising:
   an interconnection structure disposed between the first transistor and the substrate.

13. The semiconductor device according to claim 12, wherein the third diode structure is disposed in the substrate.

14. The semiconductor device according to claim 13, wherein the third diode structure is connected with the first source electrode by the interconnection structure.

15. The semiconductor device according to claim 13, wherein the third diode structure comprises:

a well having a first conductivity type; and
a doped region disposed in the well, wherein the doped region and the substrate have a second conductivity type complementary to the first conductivity type.

* * * * *